United States Patent
Drost et al.

(10) Patent No.: US 7,106,079 B2
(45) Date of Patent: Sep. 12, 2006

(54) USING AN INTERPOSER TO FACILATE CAPACITIVE COMMUNICATION BETWEEN FACE-TO-FACE CHIPS

(75) Inventors: Robert J. Drost, Mountain View, CA (US); Ronald Ho, Mountain View, CA (US); Robert J. Proebsting, Sonora, CA (US)

(73) Assignee: SUN Microsystems, Inc., Santa Clara, CA (US)

( * ) Notice: Subject to any disclaimer, the term of this patent is extended or adjusted under 35 U.S.C. 154(b) by 42 days.

(21) Appl. No.: 10/973,114

(22) Filed: Oct. 22, 2004

(65) Prior Publication Data

US 2006/0087332 A1 Apr. 27, 2006

(51) Int. Cl.
*G01R 31/00* (2006.01)

(52) U.S. Cl. .................................. 324/754; 324/158.1

(58) Field of Classification Search ............. 324/158.1, 324/754–765; 439/60–72; 438/381
See application file for complete search history.

(56) References Cited

U.S. PATENT DOCUMENTS

| | | | |
|---|---|---|---|
| 5,206,585 A * | 4/1993 | Chang et al. ................ 324/754 |
| 5,629,838 A | 5/1997 | Knight et al. ................ 361/782 |
| 5,672,979 A * | 9/1997 | Christopher ................. 324/754 |
| 6,728,113 B1 | 4/2004 | Knight et al. ................ 361/760 |
| 6,916,719 B1 | 7/2005 | Knight et al. ................ 438/381 |

* cited by examiner

*Primary Examiner*—Vinh P. Nguyen
(74) *Attorney, Agent, or Firm*—Park, Vaughan & Fleming, LLP; Edward J. Grundler

(57) ABSTRACT

A system that improves communications between capacitively coupled integrated circuit chips. The system operates by situating an interposer over capacitive communication pads on a first integrated circuit chip, wherein the interposer is made up of material that is anisotropic with respect to transmitting capacitive signals. A second integrated circuit chip is situated so that communication pads on the second integrated circuit chip are aligned to capacitively couple signals between the integrated circuit chips through the interposer. The increased dielectric permittivity caused by the interposer can improve capacitive coupling between opposing communication pads on the integrated circuit chips. The interposer can also reduce cross talk between communication pads on the first integrated circuit chip and pads adjacent to the opposing communication pads on the second integrated circuit chip.

21 Claims, 5 Drawing Sheets

USING AN INTERPOSER TO FACILATE CAPACITIVE COMMUNICATION BETWEEN FACE-TO-FACE CHIPS

GOVERNMENT LICENSE RIGHTS

This invention was made with United States Government support under Contract No. NBCH020055 awarded by the Defense Advanced Projects Administration. The United States Government has certain rights in the invention.

BACKGROUND

Related Art

The present invention relates to techniques for communicating between integrated circuits.

Recent advances in semiconductor technology have not been matched by corresponding advances in inter-chip communication technology. Semiconductor chips are typically integrated onto a printed circuit board that contains multiple layers of signal lines for inter-chip communication. However, signal lines on a semiconductor chip are about 100 times more densely packed than signal lines on a printed circuit board. Consequently, only a tiny fraction of the signal lines on a semiconductor chip can be routed across the printed circuit board to other chips. This mismatch creates a bottleneck that continues to grow as semiconductor integration densities continue to increase.

Researchers have begun to investigate alternative techniques for communicating between semiconductor chips. One promising technique involves integrating arrays of capacitive transmitters and receivers onto semiconductor chips to facilitate inter-chip communication. If a first chip is situated face-to-face with a second chip so that transmitter pads on the first chip are capacitively coupled with receiver pads on the second chip, it becomes possible to transmit signals directly from the first chip to the second chip without having to route the signal through intervening signal lines within a printed circuit board.

Face-to-face communication requires that transmitters and corresponding receivers are in close proximity to each other. This can be difficult to accomplish for a number of reasons. When a group of chips are brought together, the chips may have different functions and correspondingly different thicknesses. For example, a group of chips may include processors, memory, field programmable gate arrays, optical drivers, receivers, etc. Even chips of the same function, but manufactured on different wafers, may have different thicknesses. Wafers can be thinned to some accuracy and that accuracy can be improved through closed loop (measure/adjust) mechanical machining operations. However, achieving a uniform thickness may still be a problem. Note that non-uniform chip spacing can cause significant problems in achieving uniform signal propagation during capacitive face-to-face communication between chips.

For example, consider face-to-face chips arranged in a checkerboard pattern as shown in FIG. 1. In FIG. 1, chips 101–113 communicate with each other through overlapping regions on their four corners. In this arrangement, each chip communicates with four neighboring chips. Note that other arrangements of the chips will be obvious to a practitioner with ordinary skill in the art.

As shown in FIG. 1, chip 107 overlaps chips 104, 105, 109, and 110. If the surfaces of chips 104, 105, 109, and 110 are co-planar, then chip 107 can make equal contact with each of chips 104, 105, 109, and 110. However, if chips 105 and 109 are thicker, or are situated higher by a supporting structure, then they will tend to separate chip 107 from chips 104 and 110. In this case, chip 107 has an average spacing to chips 104 and 110, which is equal to the difference in chip surface height between chips 104 and 110 on one hand, and chips 105 and 109 on the other. If chip 107 tilts along the diagonal axis formed by the contact regions to chips 105 and 109, the gap to chip 104 or 110 will become larger and the gap to the other chip will become smaller. In other words, one of chips 104 and 110 can contact chip 107 and the other chip will have a gap of twice the difference in chip thickness.

Chips with a triangular shape rather than a rectangular shape contact on three corners. This ensures that the chip will not wobble along a diagonal axis as it can when in contact with four neighboring chips. However, if the three contacted chips are not co-planar, the triangular chip will still have some gaps relative to the three neighbors because of the tilt caused by the different thicknesses.

Proximity communication can tolerate some amount of spacing variation between the face-to-face chips. Larger spacing causes less coupling between the transmitter and receiver and hence smaller input signals. Hence, more sensitive receivers with lower offsets can deal with larger spacing. For example, in 180 nm CMOS technology, one implementation of capacitive coupling accommodates air gaps of 5 to 10 microns. Chips are presently delivered with thicknesses of 12 to 15 mils, or roughly 300 to 375 microns. Variations in this thickness are not well controlled because normal chip packaging techniques can tolerate wide variations in the chip thickness (for example, wire bonds and ball bonds can accommodate some amount of mechanical variability). Note that a chip thickness variation of 0.25 mils (6 microns) can lead to a 12 micron gap, and a variation of 0.5 mils can lead to a 25 micron gap.

SUMMARY

One embodiment of the present invention provides a system that improves communications between capacitively coupled integrated circuit chips. The system operates by situating an interposer over capacitive communication pads on a first integrated circuit chip, wherein the interposer is made up of material that is anisotropic with respect to transmitting capacitive signals. A second integrated circuit chip is situated so that communication pads on the second integrated circuit chip are aligned to capacitively couple signals between the integrated circuit chips through the interposer. The increased dielectric permittivity caused by the interposer can improve capacitive coupling between opposing communication pads on the integrated circuit chips. The interposer can also reduce cross talk between communication pads on the first integrated circuit chip and pads adjacent to the opposing communication pads on the second integrated circuit chip.

In a variation of this embodiment, the anisotropic material is made up of a plurality of columns, wherein each column has a higher permittivity than the intervening material between the columns.

In a further variation, the cross-sectional area of the column is small in comparison with the cross-sectional area of a capacitive communication pad on the integrated circuit chips.

In a further variation, the interposer comprises two layers of metal pads and micro electro-mechanical (MEM) springs that couple metal pads on the first layer of metal pads to corresponding metal pads on the second layer of metal pads.

In a further variation, the interposer comprises a nonconductive material with metal particles imbedded in the plurality of anisotropic columns.

In a further variation, the interposer is attached to one of the integrated circuit chips with an adhesive.

In a further variation, the system provides a plurality of alignment spurs on the integrated circuit chips to align the integrated circuit chips.

In a further variation, the system uses a plurality of alignment springs to align the integrated circuit chips.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

Interposer

Figure 1:
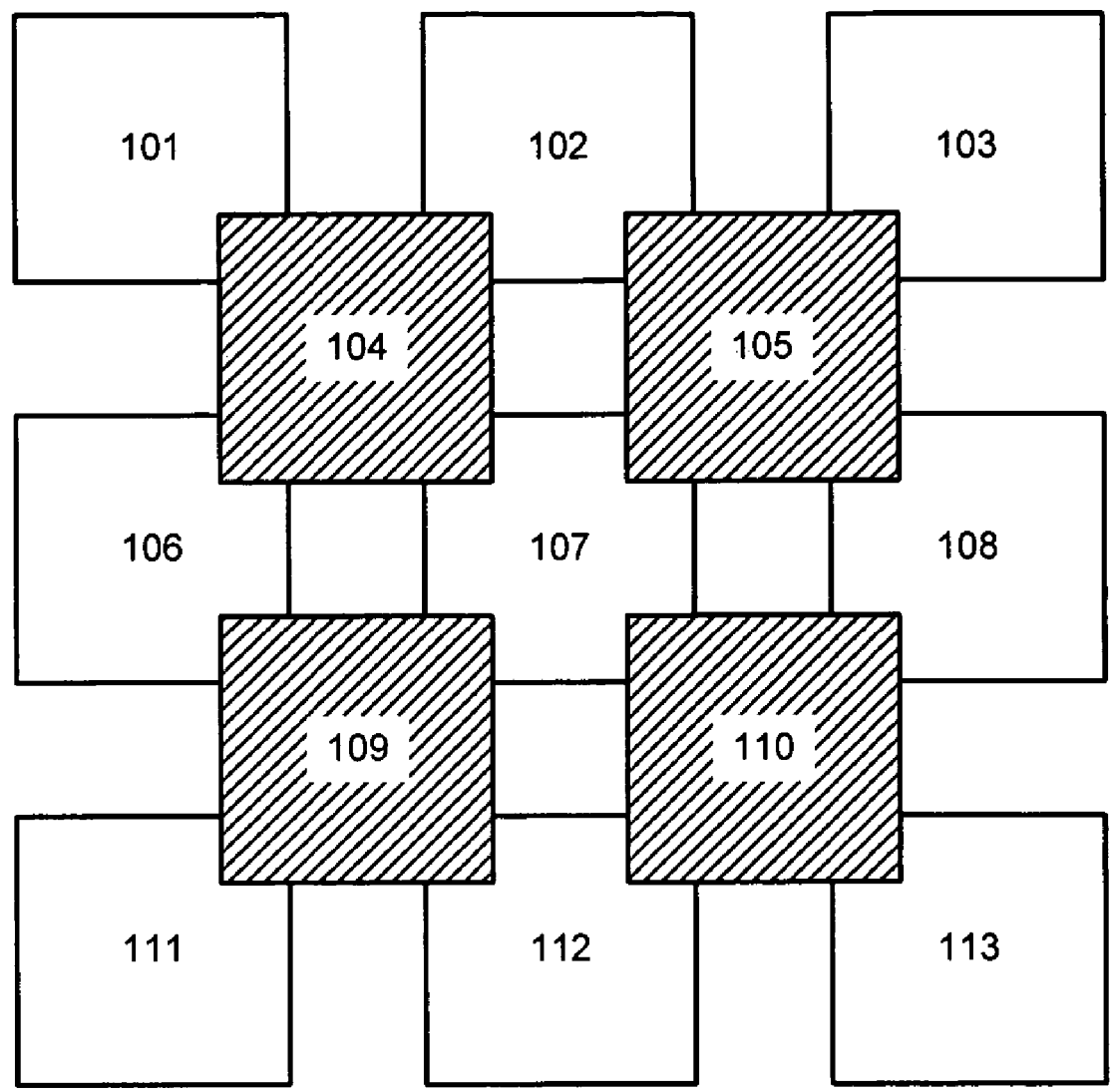
FIG. 1 illustrates a checkerboard pattern of integrated circuit chips that use face-to-face communications.
Figure 2:
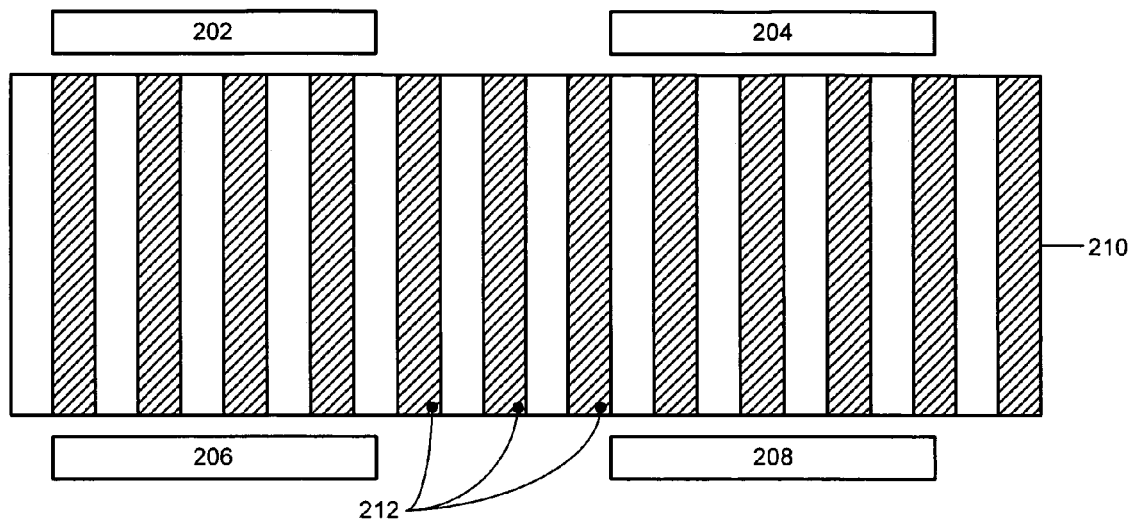
FIG. 2 illustrates a side view of an interposer in accordance with an embodiment of the present invention.

FIG. 2 illustrates a side view of an interposer 210 in accordance with an embodiment of the present invention. Interposer 210 includes multiple vertical columns 212 of higher permittivity, which cause the interposer to have anisotropic properties. Note that the spacing and size of the columns is a design selection, however a 50—50 ratio yields satisfactory results.

The size of an individual column can be small in comparison with communication pads 202, 204, 206, and 208. Note that communication pads 202 and 206 form a communicating pair as do communication pads 204 and 208. One pad in each pair is a transmitting pad, while the other pad is a receiving pad.

The anisotropic characteristic of the columns enhance communication between a communicating pair while simultaneously reducing crosstalk from adjacent transmitting pads. For example, if pads 202 and 204 are transmitting pads, communications between pads 202 and 206 are enhanced, while crosstalk between pads 202 and 208 is reduced.

Figure 3:
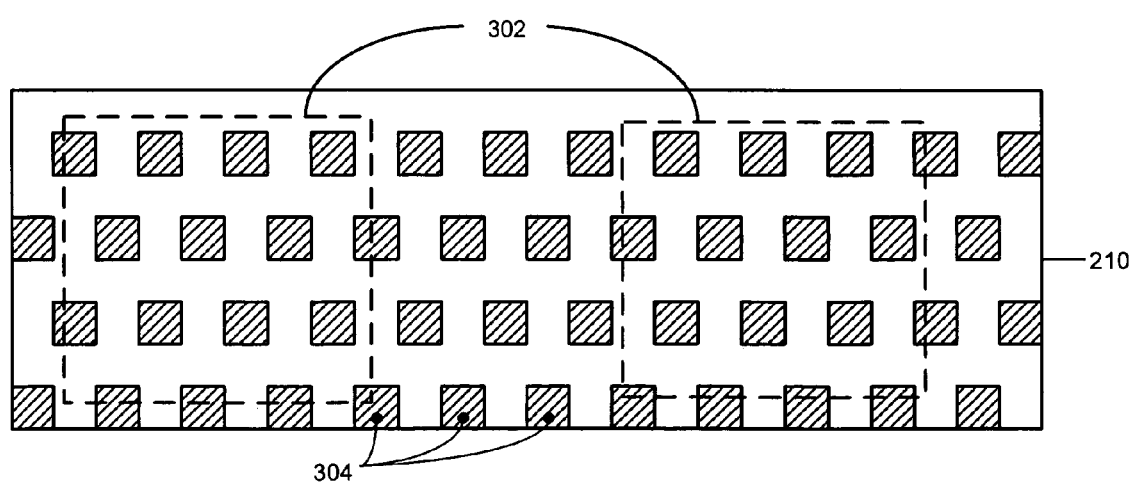
FIG. 3 illustrates a top view of an interposer in accordance with an embodiment of the present invention.

FIG. 3 illustrates a top view of an interposer 210 in accordance with an embodiment of the present invention. In FIG. 3, vertical columns within interposer 210 are illustrated as squares. Note that other shapes and arrangements are possible. Communication pads 302 are shown by the dashed lines. Note that each communication pad covers multiple vertical columns. The number of communication pads covered is a design selection based upon the size of each column, the shape of the columns, and the layout of the columns.

Interposer with MEM Springs

Figure 4:
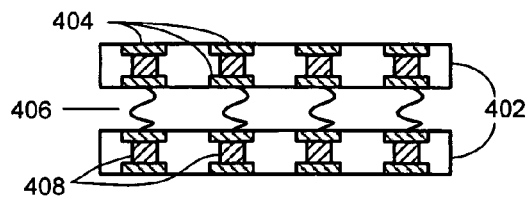
FIG. 4 illustrates an interposer with MEM springs in accordance with an embodiment of the present invention.

FIG. 4 illustrates an interposer with Micro-Electrical-Mechanical (MEM) springs in accordance with an embodiment of the present invention. The interposer illustrated in FIG. 4 includes two layers 402 with embedded metal pads 404. High dielectric material 408 is interposed between the metal pads 404. Corresponding metal pads 404 on the two layers 402 are coupled together through conductive micro electro-mechanical (MEM) springs 406. This structure gives the interposer some mechanical compliance. Note that the top ends of the MEM springs 406 can be sealed on the structure to prevent shorting of adjacent metal pads 404. Note that the springs do not have to be of the standard "spiral" variety. Other spring types, such as cantilever torsion springs can be used.

Interposer Circuit Model

Figure 5:
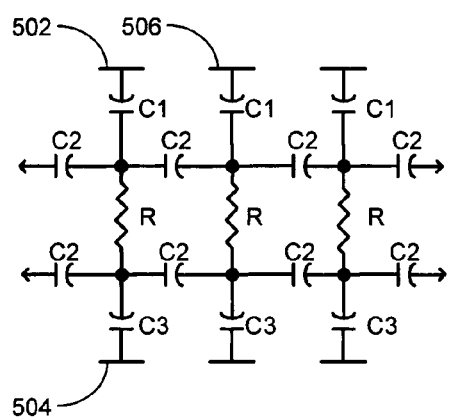
FIG. 5 illustrates a circuit model for the interposer of FIG. 4 in accordance with an embodiment of the present invention.

FIG. 5 illustrates a circuit model for the interposer of FIG. 4 in accordance with an embodiment of the present invention. The path for a normal communications from transmitting pad 502 to receiving pad 504 is from transmitting pad 502 through a capacitance C1, resistance R, and capacitance C3 to receiving pad 504. Note that capacitance C1 and C3 relates to the high dielectric material 408 described above in conjunction with FIG. 4. The crosstalk path from transmitting pad 506 to receiving pad 504 is a parallel path from transmitting pad 506 through capacitors C1 and C2, resistance R and capacitor C3 to receiving pad 504. If the capacitance of C2 is small compared to the capacitance of C1 and C3, the crosstalk signal will be smaller than the normal signal at receiving pad 504. Since the capacitance of C2 includes the lower dielectric constant of the material between the columns, the capacitance for C2 will be smaller than that of C1 and C3.

Embedded Metal Particles

Figure 6:
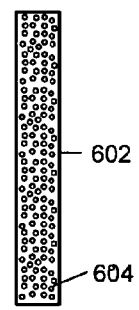
FIG. 6 illustrates a vertical interposer column with embedded metal particles in accordance with an embodiment of the present invention.

FIG. 6 illustrates a vertical interposer column with embedded metal (or other conductive material) particles in accordance with an embodiment of the present invention. Vertical interposer column 602 includes multiple particles 604 embedded within the material. These metal particles 604 can be implanted in the interposer material using standard implantation techniques. These metal particles 604 increase the dielectric constant within the interposer column so that the interposer column has a higher, and thus more favorable, dielectric constant for capacitive communication. Note that the metal particles do not need to be placed uniformly throughout the column.

Interposer Material

Figure 7A:
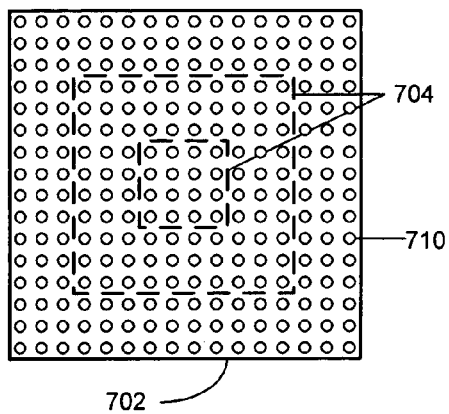
FIG. 7A illustrates a sheet of interposer material in accordance with an embodiment of the present invention.

FIG. 7A illustrates a sheet of interposer material 702 in accordance with an embodiment of the present invention. Note that the sheet of interposer material 702 can include an adhesive on one surface. Note also that the columns of high dielectric material are shown as circles 710 in FIGS. 7A, B, and C. The density of these columns is a design consideration and may have a much higher density than shown. Cut lines 704 indicate where the interposer material 702 is cut to form an interposer for a specific chip.

Figure 7B:
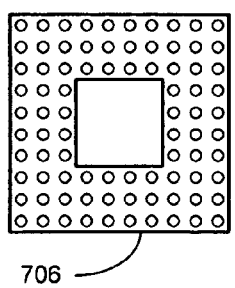
FIG. 7B illustrates an interposer cut from a sheet of interposer material in accordance with an embodiment of the present invention.
Figure 7C:
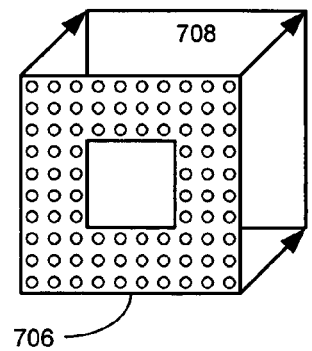
FIG. 7C illustrates the process of attaching an interposer to an integrated circuit chip in accordance with an embodiment of the present invention.

FIG. 7B illustrates an interposer cut from a sheet of interposer material in accordance with an embodiment of the present invention. By cutting the interposer material 702 along cut lines 704, interposer 706 is formed. Note that the shape and size of interposer 706 is determined from the shape and size of the chip to which interposer 706 is attached FIG. 7C illustrates the process of attaching an interposer to an integrated circuit chip in accordance with an embodiment of the present invention. Interposer 706 is attached to integrated circuit chip 708 through adhesive on a surface of interposer 706. Note that any type of known adhesive material can be used. After interposer 706 is attached to integrated circuit chip 708, integrated circuit chip is aligned relative to another integrated circuit chip as described in conjunction with FIGS. 8–12 below to allow capacitive communication between the integrated circuit chips. Note that the interposer illustrated in FIG. 7 can be of the simple column type as is illustrated in FIG. 2, or the MEM type illustrated in FIG. 4.

Alignment Spurs

Figure 8:
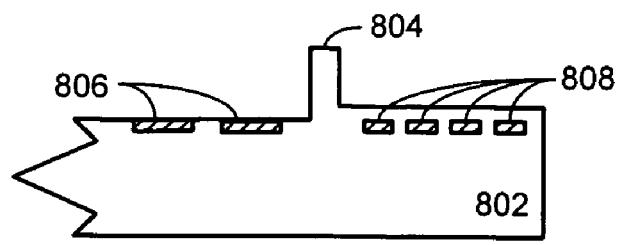
FIG. 8 illustrates alignment spurs on an integrated circuit chip in accordance with an embodiment of the present invention.

FIG. 8 illustrates alignment spurs on an integrated circuit chip in accordance with an embodiment of the present invention. Integrated circuit chip 802 includes alignment spur 804, exposed pads 806, and covered pads 808. Exposed pads 806 are used for ohmic contacts, for example power and ground connections. Covered pads 808 are used for capacitive communications with other integrated circuit chips. Spur 804 is used to align the integrated circuit chips to enable communications.

Alignment without an Interposer

Figure 9:
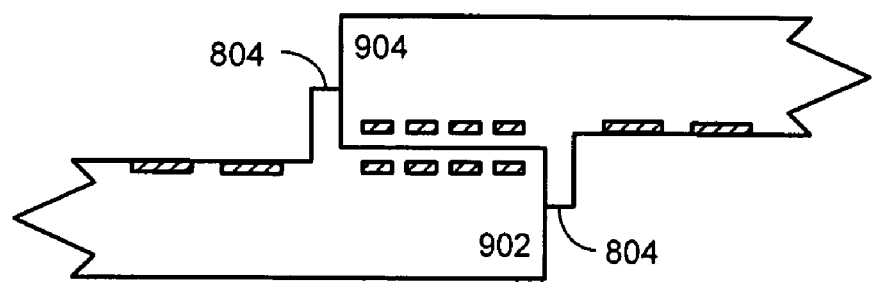
FIG. 9 illustrates the process of aligning integrated circuit chips without an interposer in accordance with an embodiment of the present invention.

FIG. 9 illustrates the process of aligning integrated circuit chips without an interposer in accordance with an embodiment of the present invention. Integrated circuit chips 902 and 904 are situated so that their communicating pads are facing each other. Alignment spurs 804 provide positive alignment of the communication pads when alignment spurs 804 are positioned against the chip ends as shown in FIG. 9.

Alignment with an Interposer

Figure 10:
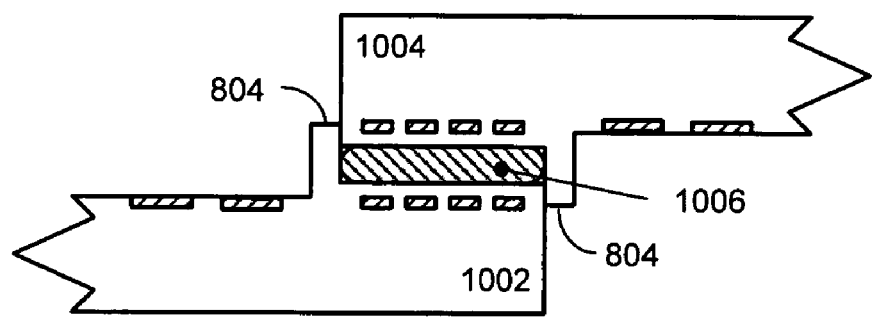
FIG. 10 illustrates the process of aligning integrated circuit chips with an interposer in accordance with an embodiment of the present invention.

FIG. 10 illustrates the process of aligning integrated circuit chips with an interposer in accordance with an embodiment of the present invention. Integrated circuit chips 1002 and 1004 are situated so that their communicating pads are facing each other, and interposer 1006 is positioned between the communication pads. Alignment spurs 804 provide positive alignment of the communication pads when alignment spurs 804 are positioned against the chip ends as shown in FIG. 9. Note that interposer 1006 is held securely in position between the faces of integrated circuit chips 1002 and 1004.

Alignment Springs

Figure 11:
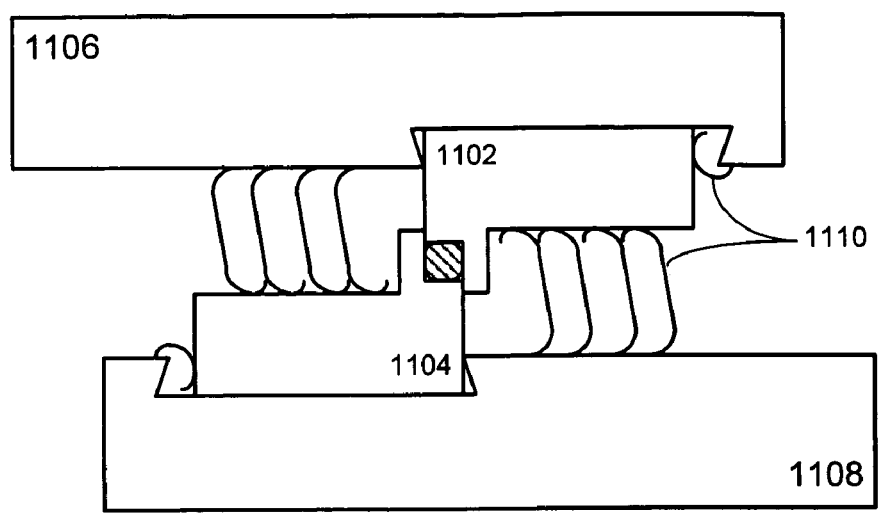
FIG. 11 illustrates a side-view of a system that uses springs to align integrated circuit chips in accordance with an embodiment of the present invention.

FIG. 11 illustrates a side view of a system that uses springs to align integrated circuit chips in accordance with an embodiment of the present invention. Integrated circuit chips 1102 and 1104 are positioned in wells within integrated chip fixtures 1106 and 1108, respectively. Springs 1110 apply pressure to the sides and tops of integrated circuit chips 1102 and 1104 to maintain their positions within integrated circuit chip fixtures 1106 and 1108.

Figure 12:
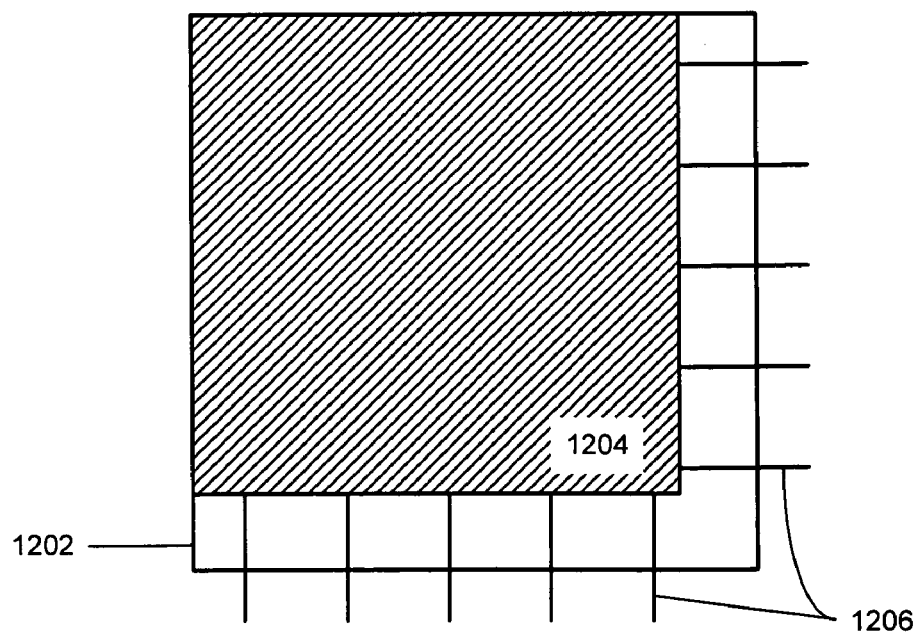
FIG. 12 illustrates a top-view of a system that uses springs to align integrated circuit chips in accordance with an embodiment of the present invention.

FIG. 12 illustrates a top view of a system that uses springs to align integrated circuit chips in accordance with an embodiment of the present invention. Integrated chip 1204 is positioned at the top left of well 1202 in the integrated circuit fixture and is held in place by pressure from springs 1206.

The foregoing descriptions of embodiments of the present invention have been presented for purposes of illustration and description only. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method for improving communication between capacitively coupled integrated circuit chips, comprising:
    placing a first integrated circuit chip near a second integrated circuit chip, wherein the first integrated circuit chip and the second integrated circuit chip communicate with each other through capacitive coupling;
    situating an interposer over capacitive communication pads on the first integrated circuit chip, wherein the interposer is composed of an anisotropic material;
    providing a plurality of alignment spurs on the first integrated circuit chip and the second integrated circuit chip to align the first integrated circuit chip and the second integrated circuit chip; and
    situating the second integrated circuit chip so that communication pads on the second integrated circuit chip are aligned to capacitively couple signals between the first integrated circuit chip and the second integrated circuit chip through the interposer;
    whereby increased dielectric permittivity of the interposer can improve capacitive coupling between opposing communication pads on the first integrated circuit chip and the second integrated circuit chip, and whereby increased dielectric permittivity of the interposer can reduce cross talk between communication pads on the first integrated circuit chip and pads adjacent to the opposing communication pads on the second integrated circuit chip.

2. The method of claim 1, wherein the anisotropic material is made up of a plurality of columns, wherein each column has a higher permittivity than the intervening material between the columns.

3. The method of claim 2, wherein a cross-sectional area of the anisotropic column is small in comparison with a cross-sectional area of a capacitive communication pad on an integrated circuit chip of the first integrated circuit chip and the second integrated circuit chip.

4. The method of claim 1, wherein the interposer comprises:
   a first layer of metal pads;
   a second layer of metal pads; and
   a plurality of micro electro-mechanical (MEM) springs that couple metal pads on the first layer of metal pads to corresponding metal pads on the second layer of metal pads.

5. The method of claim 2, wherein the interposer comprises a non-conductive material with metal particles imbedded in the plurality of anisotropic columns.

6. The method of claim 1, further comprising attaching the interposer to one of the first integrated circuit chip and the second integrated circuit chip with an adhesive.

7. The method of claim 1, further comprising using a plurality of alignment springs to align the first integrated circuit chip and the second integrated circuit chip.

8. An apparatus that facilitates communication between capacitively coupled integrated circuit chips, comprising:
   a first integrated circuit chip;
   a second integrated circuit chip, which is located near the first integrated circuit chip, wherein the first integrated circuit chip and the second integrated circuit chip communicate with each other through capacitive coupling;
   an interposer composed of an anisotropic material, which is sandwiched between the first integrated circuit chip and the second integrated circuit chip, so that communication pads on the second integrated circuit chip are aligned to capacitively couple signals between the first integrated circuit chip and the second integrated circuit chip through the interposer; and
   a plurality of alignment spurs on the first integrated circuit chip and the second integrated circuit chip to align the first integrated circuit chip and the second integrated circuit chip;
   whereby increased dielectric permittivity of the interposer can improve capacitive coupling between opposing communication pads on the first integrated circuit chip and the second integrated circuit chip, and whereby the interposer can reduce cross talk between communication pads on the first integrated circuit chip and pads adjacent to the opposing communication pads on the second integrated circuit chip.

9. The apparatus of claim 8, wherein the anisotropic material is made up of a plurality of columns, wherein each column has a higher permittivity than the intervening material between the columns.

10. The apparatus of claim 9, wherein a cross-sectional area of the anisotropic column is small in comparison with a cross-sectional area of a capacitive communication pad on an integrated circuit chip of the first integrated circuit chip and the second integrated circuit chip.

11. The apparatus of claim 8, wherein the interposer comprises:
   a first layer of metal pads;
   a second layer of metal pads; and
   a plurality of micro electro-mechanical (MEM) springs that couple metal pads on the first layer of metal pads to corresponding metal pads on the second layer of metal pads.

12. The apparatus of claim 9, wherein the interposer comprises a non-conductive material with metal particles imbedded in the plurality of anisotropic columns.

13. The apparatus of claim 8, further comprising an attaching mechanism for attaching the interposer to one of the first integrated circuit chip and the second integrated circuit chip with an adhesive.

14. The apparatus of claim 8, further comprising a plurality of alignment springs to align the first integrated circuit chip and the second integrated circuit chip.

15. An apparatus for improving communication between capacitively coupled integrated circuit chips, comprising:
   a placing mechanism configured to place a first integrated circuit chip near a second integrated circuit chip, wherein the first integrated circuit chip and the second integrated circuit chip communicate with each other through capacitive coupling;
   an alignment mechanism configured to provide a plurality of alignment spurs on the first integrated circuit chip and the second integrated circuit chip to align the first integrated circuit chip and the second integrated circuit chip;
   a situating mechanism configured to situate an interposer over capacitive communication pads on the first integrated circuit chip, wherein the interposer is composed of an anisotropic material; and
   wherein the situating mechanism is further configured to situate the second integrated circuit chip so that communication pads on the second integrated circuit chip are aligned to capacitively couple signals between the first integrated circuit chip and the second integrated circuit chip through the interposer;
   whereby increased dielectric permittivity of the interposer can improve capacitive coupling between opposing communication pads on the first integrated circuit chip and the second integrated circuit chip, and whereby the interposer can reduce cross talk between communication pads on the first integrated circuit chip and pads adjacent to the opposing communication pads on the second integrated circuit chip.

16. The apparatus of claim 15, wherein the anisotropic material is made up of a plurality of columns, wherein each column has a higher permittivity than the intervening material between the columns.

17. The apparatus of claim 16, wherein a cross-sectional area of the anisotropic column is small in comparison with a cross-sectional area of a capacitive communication pad on an integrated circuit chip of the first integrated circuit chip and the second integrated circuit chip.

18. The apparatus of claim 15, wherein the interposer comprises:
   a first layer of metal pads;
   a second layer of metal pads; and
   a plurality of micro electro-mechanical (MEM) springs that couple metal pads on the first layer of metal pads to corresponding metal pads on the second layer of metal pads.

19. The apparatus of claim 16, wherein the interposer comprises a non-conductive material with metal particles imbedded in the plurality of anisotropic columns.

20. The apparatus of claim 15, further comprising an attaching mechanism configured to attach the interposer to one of the first integrated circuit chip and the second integrated circuit chip with an adhesive.

21. The apparatus of claim 15, further comprising an alignment mechanism configured to use a plurality of alignment springs to align the first integrated circuit chip and the second integrated circuit chip.

* * * * *